(12) United States Patent
Tsutsumi et al.

(10) Patent No.: US 11,710,615 B2
(45) Date of Patent: Jul. 25, 2023

(54) CHARGED PARTICLE BEAM DEVICE AND ANALYSIS METHOD

(71) Applicant: JEOL Ltd., Tokyo (JP)

(72) Inventors: Kenichi Tsutsumi, Tokyo (JP); Tatsuya Uchida, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 17/586,949

(22) Filed: Jan. 28, 2022

(65) Prior Publication Data

US 2022/0157558 A1    May 19, 2022

Related U.S. Application Data

(62) Division of application No. 17/017,859, filed on Sep. 11, 2020, now Pat. No. 11,315,753.

(30) Foreign Application Priority Data

Sep. 13, 2019 (JP) ................. 2019-166868

(51) Int. Cl.
*H01J 37/244* (2006.01)
*H01J 37/147* (2006.01)
(Continued)

(52) U.S. Cl.
CPC ........ *H01J 37/244* (2013.01); *H01J 37/1474* (2013.01); *H01J 37/24* (2013.01);
(Continued)

(58) Field of Classification Search
CPC .......... H01J 37/00; H01J 37/02; H01J 37/244; H01J 37/1474; H01J 37/24; H01J 37/28;
(Continued)

(56) References Cited

U.S. PATENT DOCUMENTS

| 3,749,926 A | 7/1973 | Lee |
| 5,608,218 A | 3/1997 | Sato et al. |
| 2011/0210246 A1 | 9/2011 | Cohen |
| 2015/0083907 A1* | 3/2015 | Yoshida ............... G01J 3/30 250/307 |
| 2016/0111251 A1 | 4/2016 | Knippelmeyer et al. |

(Continued)

FOREIGN PATENT DOCUMENTS

| JP | 7192679 A | 7/1995 |
| JP | 2006114426 A | 4/2006 |

OTHER PUBLICATIONS

Janssen et al., High Spatial Resolution Surface Potential Measurements Using Secondary Electrons, Surface Science, 1980, vol. 93, pp. 453-470.

Skinner et al., Refinements to a Standard LEED-Auger System for the Analysis of Electron Emission at Low Primary Beam Energies, The Review of Scientific Instruments, May 1972, vol. 43, No. 5, pp. 731-734.

(Continued)

*Primary Examiner* — Jason L McCormack
(74) *Attorney, Agent, or Firm* — The Webb Law Firm

(57) ABSTRACT

A charged particle beam device includes: a charged particle beam source; an analyzer that analyzes and detects particles including secondary electrons and backscattered charged particles that are emitted from a specimen by irradiating the specimen with a primary charged particle beam emitted from the charged particle beam source; a bias voltage applying unit that applies a bias voltage to the specimen; and an analysis unit that extracts a signal component of the secondary electrons based on a first spectrum obtained by detecting the particles with the analyzer in a state where a first bias voltage is applied to the specimen, and a second spectrum obtained by detecting the particles with the analyzer in a state where a second bias voltage different from the first bias voltage is applied to the specimen.

4 Claims, 14 Drawing Sheets

(51) Int. Cl.
*H01J 37/24* (2006.01)
*H01J 37/28* (2006.01)

(52) U.S. Cl.
CPC ....... *H01J 37/28* (2013.01); *H01J 2237/0473* (2013.01); *H01J 2237/221* (2013.01); *H01J 2237/2448* (2013.01); *H01J 2237/24475* (2013.01)

(58) Field of Classification Search
CPC .................. H01J 37/256; H01J 37/26; H01J 2237/0473; H01J 2237/221; H01J 2237/24475; H01J 2237/2448; H01J 2237/24485; H01J 2237/24495; H01J 2237/2511
USPC ................................ 250/306, 307, 310, 311
See application file for complete search history.

(56) References Cited

U.S. PATENT DOCUMENTS

| 2016/0245762 A1* | 8/2016 | Owen ................... H01J 37/244 |
| 2017/0062180 A1 | 3/2017 | Budach et al. |
| 2017/0186583 A1* | 6/2017 | Shirahata ................ H01J 37/12 |

OTHER PUBLICATIONS

Aristov et al., Development and New Applications of Microtomography Modulational Methods in Scanning Electron Microscopy, Bulletin of the Russian Academy of Sciences, 1997, vol. 61, No. 10, pp. 1526-1531.
Extended European Search Report issued in EP20195350.2 dated Jan. 13, 2021.
Office Action issued in JP2019166868 dated Jun. 29, 2021.

* cited by examiner

CHARGED PARTICLE BEAM DEVICE AND ANALYSIS METHOD

CROSS-REFERENCE TO RELATED APPLICATION

The present application is a divisional of U.S. patent application Ser. No. 17/017,859, filed on Sep. 11, 2020, which claims priority to Japanese Patent Application No. 2019-166868 filed Sep. 13, 2019, the disclosures of which are hereby incorporated by reference in their entirety.

BACKGROUND OF THE INVENTION

Field of the Invention

The present invention relates to a charged particle beam device and an analysis method.

Description of Related Art

Electrons emitted from the surface of a solid specimen upon irradiation of an electron beam thereto are roughly divided into secondary electrons and backscattered electrons. The secondary electrons are electrons that intrinsically exist in the specimen and have important information about the surface state of the specimen such as the surface form, work function, and Auger electrons. Meanwhile, the backscattered electrons are electrons that are injected by an incident electron beam and have information about a crystal structure in a slightly deeper level than the surface of the specimen, such as an average atomic number, crystal orientation, and plasmon loss of the specimen.

Here, electrostatic energy $U_T$ of electrons can be expressed as the sum of the kinetic energy K of the electrons and potential energy P at a location, where the electrons are generated, as in expression below.

$$U_T = K + P \text{ (eV)}$$

The electrostatic energy $U_T$ is always constant according to the energy conservation law.

In a typical electron microscope, the kinetic energy K of electrons generated by an electron gun is nearly zero, and the potential energy P of electrons generated by the electron gun becomes $E_P$ under acceleration voltage $E_P$. For the electrons generated by the electron gun, K=0 and P=$E_P$. The specimen is irradiated with the electrons generated by the electron gun, with the electrostatic energy thereof being maintained, and the potential energy P of the electrons becomes zero on a grounded specimen surface, whereby the kinetic energy K of the electrons is $E_P$. More specifically, K=$E_P$ and P=0 hold for the electrons at the grounded specimen surface.

Since the potential energy P of the secondary electrons generated at the specimen surface is always zero (P=0) as long as the surface is grounded, the energy of the secondary electrons generated at the specimen surface is entirely equal to kinetic energy K. The Auger electron spectroscopy uses this relation and spectroscopically analyzes the kinetic energy of the generated secondary electrons, thereby detecting Auger peaks to perform elemental analysis.

However, according to the method, the secondary electrons and backscattered electrons cannot be distinguished from each other. Therefore, a total electron spectrum, obtained by combining the secondary electrons and the backscattered electrons, has to be measured, and this increases the background and lowers the sensitivity.

For example, JP-A-7-192679 discloses an electron microscope, in which an electromagnetic field that separates the orbits of backscattered electrons and secondary electrons generated at a specimen is provided on an optical system from an electron source to the specimen and in which a backscattered electron detector that detects backscattered electrons is provided on the orbit of the generated backscattered electrons, whereby the secondary electrons and the backscattered electrons, which are generated from the specimen, are separated and therefore a backscattered electron signal can efficiently be detected.

In the analysis method such as Auger electron spectroscopy described above, when a signal derived from secondary electrons and a signal derived from backscattered electrons can be distinguished, higher quality analysis can be performed.

SUMMARY OF THE INVENTION

According to a first aspect of the invention, there is provided a charged particle beam device including:
 a charged particle beam source;
 an analyzer that analyzes and detects particles including secondary electrons and backscattered charged particles that are emitted from a specimen by irradiating the specimen with a primary charged particle beam emitted from the charged particle beam source;
 a bias voltage applying unit that applies a bias voltage to the specimen; and
 an analysis unit that extracts a signal component of the secondary electrons based on a first spectrum obtained by detecting the particles with the analyzer in a state where a first bias voltage is applied to the specimen, and a second spectrum obtained by detecting the particles with the analyzer in a state where a second bias voltage different from the first bias voltage is applied to the specimen.

According to a second aspect of the invention, there is provided a charged particle beam device including:
 a charged particle beam source;
 an energy applying unit that varies kinetic energy of a primary charged particle beam emitted from the charged particle beam source;
 an analyzer that analyzes and detects particles including secondary electrons and backscattered charged particles that are emitted from a specimen by irradiating the specimen with the primary charged particle beam; and
 an analysis unit that extracts a signal component of the backscattered charged particles based on a first spectrum obtained by detecting the particles with the analyzer in a state where the kinetic energy of the primary charged particle beam has been varied into first kinetic energy, and a second spectrum obtained by detecting the particles with the analyzer in a state where the kinetic energy of the primary charged particle beam has been varied into second kinetic energy different from the first kinetic energy.

According to a third aspect of the invention, there is provided an analysis method for use in a charged particle beam device including a charged particle beam source and an analyzer that analyzes and detects particles including secondary electrons and backscattered charged particles that are emitted from a specimen by irradiating the specimen with a primary charged particle beam emitted from the charged particle beam source, the analysis method including:
 obtaining a first spectrum obtained by detecting the particles with the analyzer in a state where a first bias voltage is applied to the specimen;

obtaining a second spectrum obtained by detecting the particles with the analyzer in a state where a second bias voltage different from the first bias voltage is applied to the specimen; and extracting a signal component of the secondary electrons based on the first spectrum and the second spectrum.

According to a fourth aspect of the invention, there is provided an analysis method for use in a charged particle beam device including a charged particle beam source and an analyzer that analyzes and detects particles including secondary electrons and backscattered charged particles that are emitted from a specimen by irradiating the specimen with a primary charged particle beam emitted from the charged particle beam source, the analysis method including:

obtaining a first spectrum obtained by detecting the particles with the analyzer in a state where kinetic energy of the primary charged particle beam has been varied into first kinetic energy;

obtaining a second spectrum obtained by detecting the particles with the analyzer in a state where the kinetic energy of the primary charged particle beam has been varied into second kinetic energy different from the first kinetic energy; and extracting a signal component of the backscattered charged particles based on the first spectrum and the second spectrum.

Figure 1:
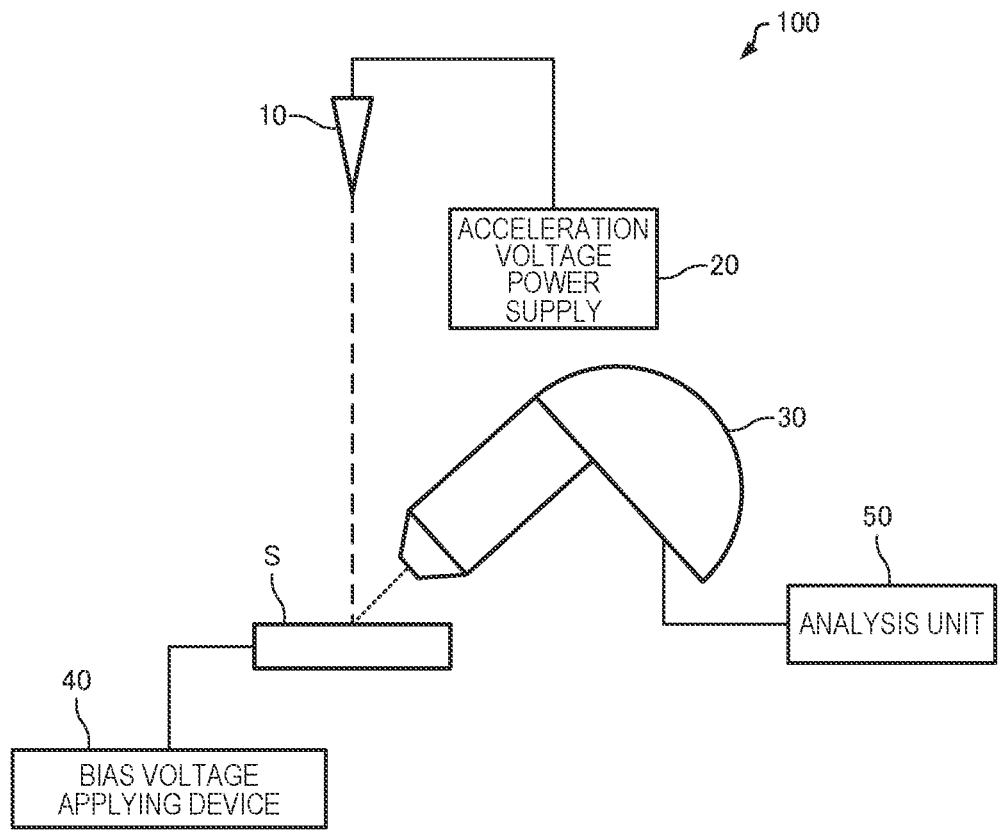
FIG. 1 is a diagram illustrating a configuration of an electron microscope according to a first embodiment of the invention.

DESCRIPTION OF THE INVENTION (1) According to an embodiment of the invention, there is provided a charged particle beam device including:

a charged particle beam source;

an analyzer that analyzes and detects particles including secondary electrons and backscattered charged particles that are emitted from a specimen by irradiating the specimen with a primary charged particle beam emitted from the charged particle beam source;

a bias voltage applying unit that applies a bias voltage to the specimen; and an analysis unit that extracts a signal component of the secondary electrons based on a first spectrum obtained by detecting the particles with the analyzer in a state where a first bias voltage is applied to the specimen, and a second spectrum obtained by detecting the particles with the analyzer in a state where a second bias voltage different from the first bias voltage is applied to the specimen.

The charged particle beam device can extract a signal component of the secondary electrons based on the first and second spectrums. In this way, the spectrum of the secondary electrons can be obtained.

(2) According to an embodiment of the invention, there is provided a charged particle beam device including:

a charged particle beam source;

an energy applying unit that varies kinetic energy of a primary charged particle beam emitted from the charged particle beam source;

an analyzer that analyzes and detects particles including secondary electrons and backscattered charged particles that are emitted from a specimen by irradiating the specimen with the primary charged particle beam; and an analysis unit that extracts a signal component of the backscattered charged particles based on a first spectrum obtained by detecting the particles with the analyzer in a state where the kinetic energy of the primary charged particle beam has been varied into first kinetic energy, and a second spectrum obtained by detecting the particles with the analyzer in a state where the kinetic energy of the primary charged particle beam has been varied into second kinetic energy different from the first kinetic energy.

The charged particle beam device can extract a signal component of the backscattered charged particles based on the first and second spectrums. In this way, the spectrum of the backscattered charged particles can be obtained.

(3) According to an embodiment of the invention, there is provided an analysis method for use in a charged particle beam device including a charged particle beam source and an analyzer that analyzes and detects particles including secondary electrons and backscattered charged particles that are emitted from a specimen by irradiating the specimen with a primary charged particle beam emitted from the charged particle beam source, the analysis method including:

obtaining a first spectrum obtained by detecting the particles with the analyzer in a state where a first bias voltage is applied to the specimen;

obtaining a second spectrum obtained by detecting the particles with the analyzer in a state where a second bias voltage different from the first bias voltage is applied to the specimen; and extracting a signal component of the secondary electrons based on the first spectrum and the second spectrum.

According to the analysis method, a signal component of the secondary electrons can be extracted based on the first and second spectrums. In this way, the spectrum of the secondary electrons can be obtained.

(4) According to an embodiment of the invention, there is provided an analysis method for use in a charged particle beam device including a charged particle beam source and an analyzer that analyzes and detects particles including secondary electrons and backscattered charged particles that are emitted from a specimen by irradiating the specimen with a primary charged particle beam emitted from the charged particle beam source, the analysis method including:

obtaining a first spectrum obtained by detecting the particles with the analyzer in a state where kinetic energy of the primary charged particle beam has been varied into first kinetic energy;

obtaining a second spectrum obtained by detecting the particles with the analyzer in a state where the kinetic energy of the primary charged particle beam has been varied into second kinetic energy different from the first kinetic energy; and extracting a signal component of the backscattered charged particles based on the first spectrum and second spectrum.

According to the analysis method, a signal component of the backscattered charged particles can be extracted based on the first and second spectrums. In this way, the spectrum of the backscattered charged particles can be obtained.

Preferred embodiments of the invention are described in detail below with reference to the drawings. It is noted that the following embodiments do not unduly limit the scope of the invention as stated in the claims. In addition, all of the elements described below are not necessarily essential requirements of the invention.

In the following, an electron microscope which observes a specimen by emitting an electron beam on the specimen will be described as an example of a charged particle beam device according to the invention, while the charged particle beam device according to the invention may include a device which observes a specimen by emitting a charged particle beam (such as an ion beam) other than an electron beam on the specimen.

1. First Embodiment

1.1. Electron Microscope

An electron microscope according to a first embodiment of the invention will be described with reference to the drawings. FIG. 1 is a diagram illustrating a configuration of an electron microscope 100 according to the first embodiment.

As illustrated in FIG. 1, the electron microscope 100 includes an electron gun 10 (as an example of a charged particle beam source), an acceleration voltage power supply 20, an electron analyzer 30, a bias voltage applying device 40 (as an example of a bias voltage applying unit), and an analysis unit 50. Note that the electron microscope 100 may be a scanning electron microscope or a transmission electron microscope. The electron microscope 100 may be an Auger microprobe.

The electron gun 10 generates an electron beam (an example of a primary charged particle beam). In the electron gun 10, electrons emitted from the cathode are accelerated by acceleration voltage applied between the cathode and the anode and emitted from the electron gun 10. The acceleration voltage power supply 20 supplies acceleration voltage.

Although not shown, the electron microscope 100 includes an illumination optical system for irradiating a specimen with an electron beam. The illumination optical system directs an electron beam emitted from the electron gun 10 on the specimen S. The illumination optical system may include a condenser lens, an objective lens, a diaphragm, and a deflector. For example, if the electron microscope 100 is a scanning electron microscope or a scanning transmission electron microscope, the illumination optical system includes a scanning deflector for scanning the specimen S with an electron beam.

The electron analyzer 30 detects electrons (an example of particles) including secondary electrons and backscattered electrons (an example of backscattered charged particles) emitted from the specimen S on irradiation of the specimen with an electron beam (an example of a primary charged particle beam). The electron analyzer 30 can divide the incident electrons based on kinetic energy and count the number of electrons having particular energy. Using the electron analyzer 30, a spectrum with energy on the abscissa and the number of electrons (intensity) on the ordinate can be obtained. The electron analyzer 30 may be an electrostatic hemispherical analyzer.

The bias voltage applying device 40 applies bias voltage to the specimen S. The bias voltage applying device 40 can apply desired bias voltage to the specimen S. The bias voltage applying device 40 can vary the bias voltage applied to the specimen S.

The analysis unit 50 obtains an output signal from the electron analyzer 30 and obtains a spectrum based on the output signal. The analysis unit 50 can extract the signal component of the secondary electrons based on a plurality of spectrums measured under application of different bias voltages. The analysis unit 50 may include a central processing unit (CPU) and a storage device (such as a random access memory (RAM) and a read only memory (ROM)). The analysis unit 50 performs various kinds of computation processing and various kinds of control processing as the CPU executes a program stored in the storage device.

1.2. Principles

In the electron microscope 100, a specimen S is irradiated with an electron beam, the electron analyzer 30 detects electrons emitted from the specimen S as a result of the irradiation and extracts a signal component of secondary electrons from the spectrum of the electrons obtained by the detection, and the spectrum of the secondary electrons can be obtained. This principle will be described in the following.

Figure 2:
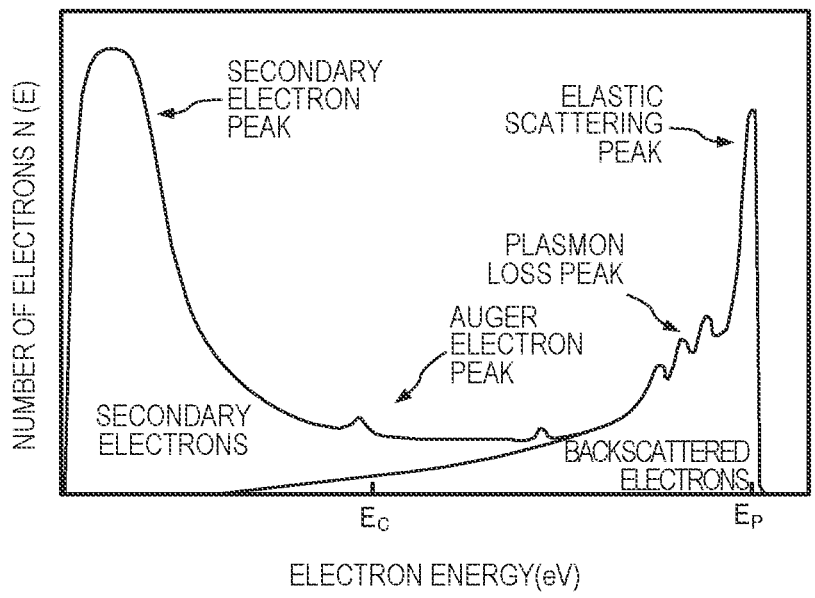
FIG. 2 is a graph illustrating an energy distribution of electrons emitted from a specimen surface.
Figure 3:
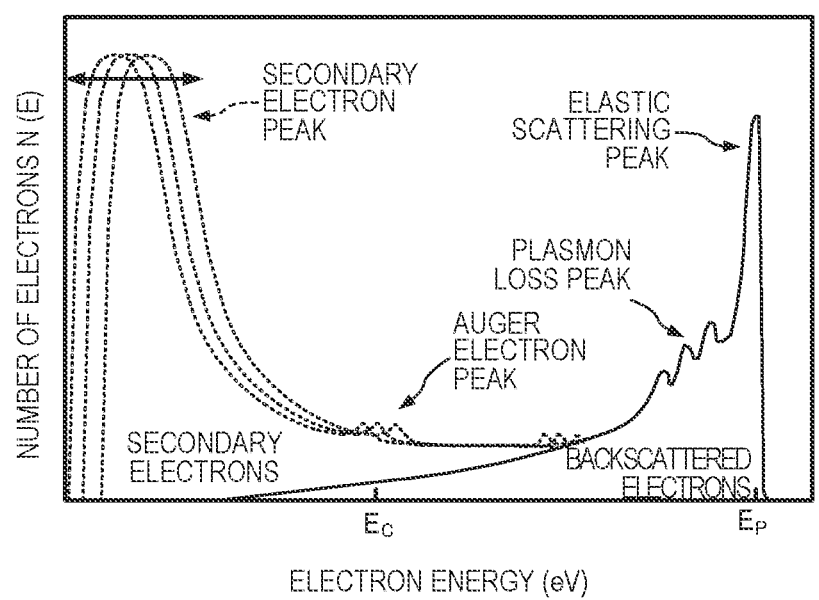
FIG. 3 is a graph illustrating an energy distribution of electrons emitted from a specimen surface when bias voltage is varied.

FIG. 2 illustrates an energy distribution of electrons emitted from the specimen surface when the specimen S is irradiated with an electron beam or the energy spectrum of the electrons. FIG. 3 illustrates an energy distribution of electrons emitted from the specimen surface when the bias voltage applied to the specimen is varied.

As illustrated in FIG. 2, the spectrum of electrons emitted from the specimen surface obtained by irradiating the specimen S with an electron beam includes a signal component of the secondary electrons and a signal component of the backscattered electrons. The secondary electrons are electrons excited from the atoms that make up the specimen by inelastic scattering of the electron beam in the specimen.

The backscattered electrons are backscattered in the process of scattering when the specimen is irradiated with an electron beam.

When electrons emitted from the specimen surface as a result of electron beam irradiation are detected by the electron analyzer 30, so that the spectrum thereof is measured, and the bias voltage applied to the specimen is varied, the signal component of the secondary electrons fluctuates as illustrated in FIG. 3. At the time, the signal component of the backscattered electrons does not fluctuate. The electrostatic potential $U_{SE}$ of the secondary electrons at the time is as follows.

$$U_{SE} = K + P = K + V_S + \Delta V_S \text{ (eV)}$$

where K is the kinetic energy, P is the potential energy, $V_S$ is the bias voltage, and $\Delta V_S$ is the variation in the bias voltage.

For example, when the bias voltage $V_S$ is set as $V_S \approx 0$, the secondary electron peak fluctuates around the original energy value.

Figure 4:
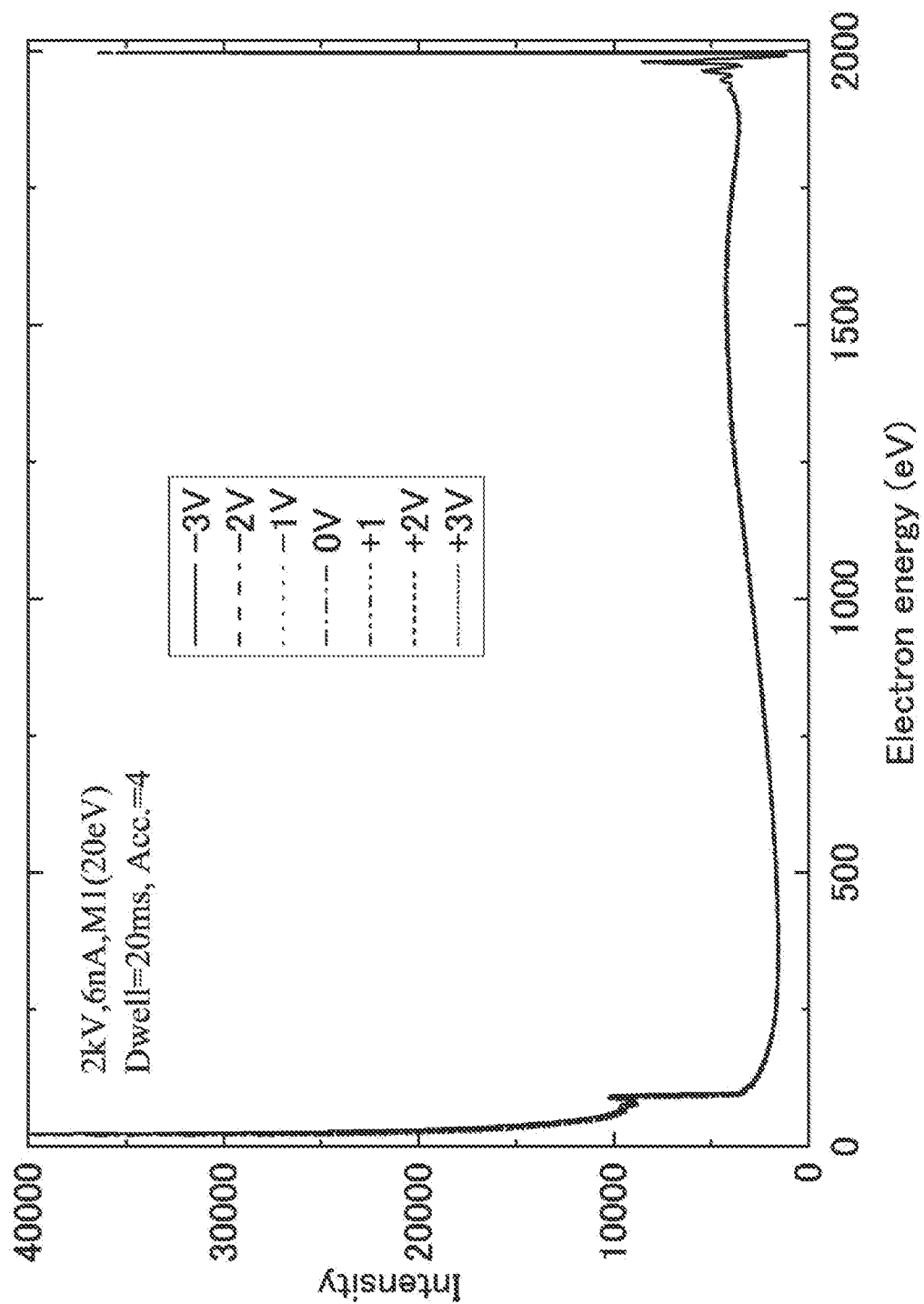
FIG. 4 is a graph illustrating change in spectrum when a bias voltage is varied.
Figure 5:
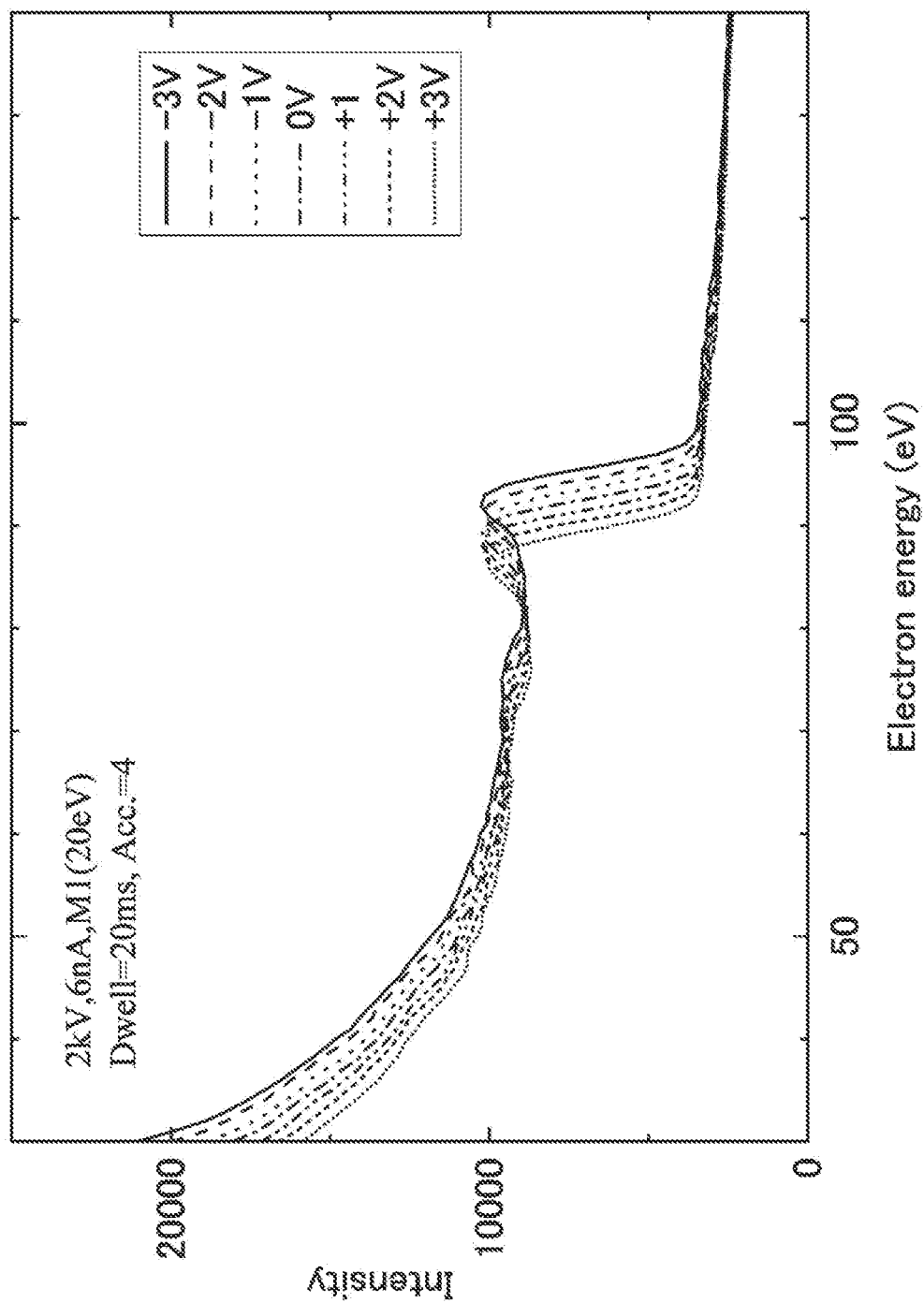
FIG. 5 is a graph illustrating change in spectrum when a bias voltage is varied.
Figure 6:
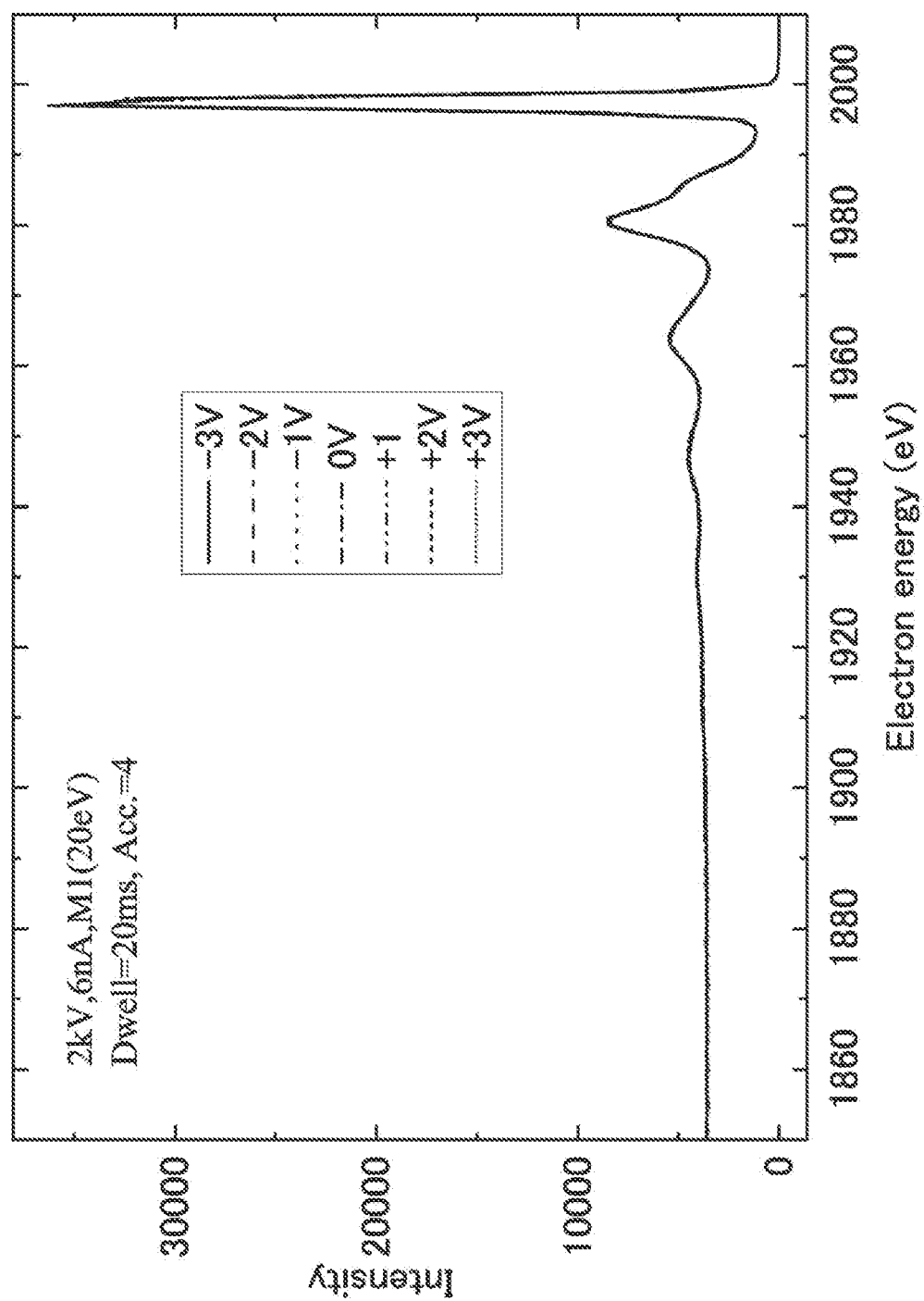
FIG. 6 is a graph illustrating change in spectrum when a bias voltage is varied.

FIG. 4 illustrates change in spectrum when the bias voltage applied to the specimen is varied. FIG. 5 is an enlargement of the low energy side in FIG. 4, and FIG. 6 is an enlargement of the high energy side in FIG. 4. FIGS. 4 to 6 illustrate spectrums when $\Delta V_S = +3$ V, $\Delta V_S = +2$ V, $\Delta V_S = +1$ V, $\Delta V_S = 0$ V, $\Delta V_S = -1$ V, $\Delta V_S = -2$ V, and $\Delta V_S = -3$ V.

As illustrated in FIG. 5, when the bias voltage is varied, the peaks derived from the secondary electrons fluctuate. In contrast, as illustrated in FIG. 6, the peaks derived from the backscattered electrons does not fluctuate. In this way, when the bias voltage applied to the specimen is varied, the signal component of the secondary electrons fluctuates and the signal component of the backscattered electrons does not fluctuate.

Figure 7:
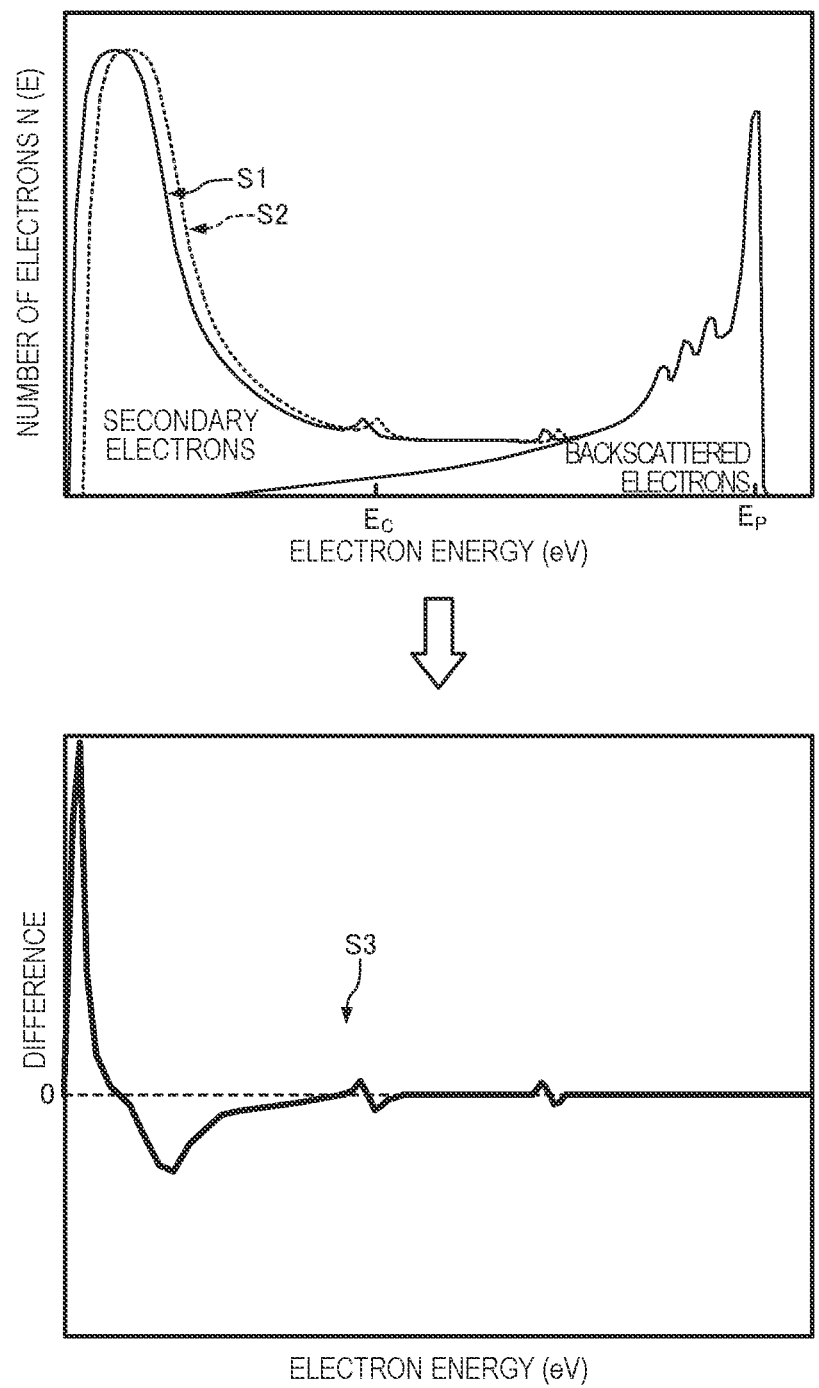
FIG. 7 is a graph illustrating a method of extracting a signal component of secondary electrons.

FIG. 7 illustrates a method of extracting a signal component of the secondary electrons.

As described above, when the bias voltage applied to the specimen is varied, a signal component of the secondary electrons fluctuates, and a signal component of the backscattered electrons does not fluctuate. Therefore, for example as illustrated in FIG. 7, a signal component of the secondary electrons can be extracted based on a first spectrum S1 of the electrons under application of a first bias voltage to the specimen and a second spectrum S2 under application of a second bias voltage different from the first bias voltage to the specimen. For example, the difference between the first spectrum S1 and the second spectrum S2 can be determined, and a signal component of the secondary electrons can be extracted based on the difference.

Specifically, when the difference S1−S2 between the first spectrum S1 and the second spectrum S2 is obtained, a difference spectrum S3 is obtained as illustrated in FIG. 7. The difference spectrum S3 has the difference between the intensity of the first spectrum S1 and the intensity of the second spectrum S2 on the ordinate and the electron energy on the abscissa.

As the signal component of the secondary electrons varies when the bias voltage is varied, the difference spectrum S3 has for example a pair of positive and negative peaks corresponding to the peaks derived from the secondary electrons in the first and second spectrums S1 and S2. In contrast, since the peaks derived from the backscattered electrons do not vary even when the bias voltage is varied, the difference spectrum S3 does not have peaks corresponding to the peaks derived from the backscattered electrons in the first and second spectrums S1 and S2. Therefore, the signal component of the secondary electrons can be extracted by determining the difference S1−S2 between the first spectrum S1 and the second spectrum S2.

1.3. Processing

Figure 8:
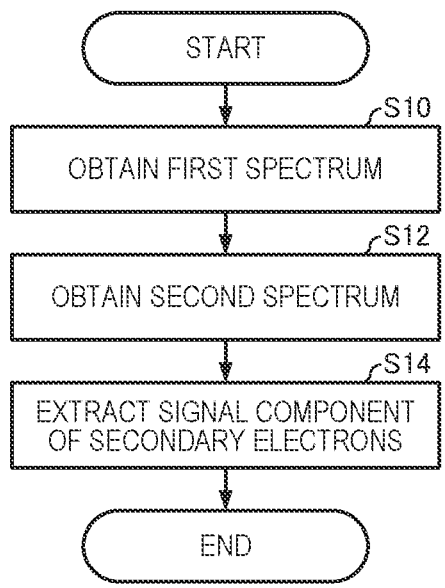
FIG. 8 is a flowchart illustrating an example of processing performed by an analysis unit.

FIG. 8 is a flowchart illustrating an example of processing performed by the analysis unit 50.

The analysis unit 50 first obtains a first spectrum (S10). The first spectrum is obtained by irradiating the specimen S with an electron beam under application of the first bias voltage to the specimen S by the bias voltage applying device 40 and detecting electrons emitted from the specimen S by the electron analyzer 30.

Then, the analysis unit 50 obtains the second spectrum (S12). The second spectrum is obtained by irradiating the specimen S with an electron beam under application of the second bias voltage different from the first bias voltage to the specimen S by the bias voltage applying device 40 and detecting electrons emitted from the specimen S by the electron analyzer 30.

Then, the analysis unit 50 extracts a signal component of the secondary electrons based on the first and second spectrums (S14). For example, the analysis unit 50 determines the difference between the first spectrum and the second spectrum and extracts a signal component of the secondary electrons based on the difference.

The above described processing allows the signal component of the secondary electrons to be extracted.

1.4. Generation of Secondary Electron Image

In the electron microscope 100, a secondary electron image can be obtained by scanning the specimen S with an electron beam by a scanning deflector and measuring the first and second spectrums at each irradiation position on the specimen S.

Specifically, the first and second spectrums are measured at each irradiation position on the specimen S. For example, at the first irradiation position, the first bias voltage is applied to the specimen S to measure the first spectrum, and then the second bias voltage is applied to the specimen S to measure the second spectrum. Similarly, at the next irradiation position, the first spectrum is measured by applying the first bias voltage to the specimen S, and then the second spectrum is measured by applying the second bias voltage to the specimen S. This is repeatedly carried out to determine the first and second spectrums at each irradiation position on the specimen S.

Note that the first spectrum at each irradiation position may be measured by scanning the specimen S with an electron beam under application of the first bias voltage to the specimen S, and then the second spectrum may be measured by scanning the specimen S with an electron beam under application of the second bias voltage to the specimen S.

Then, the analysis unit 50 generates a secondary electron image based on the first and second spectrums at each irradiation position.

Figure 9:
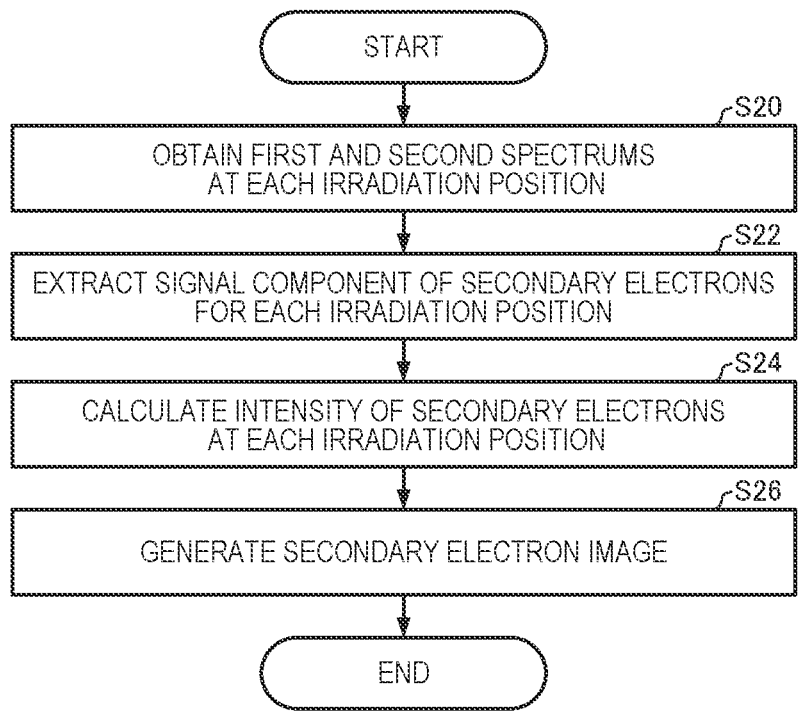
FIG. 9 is a flowchart illustrating an example of processing performed by an analysis unit.

FIG. 9 is a flowchart illustrating an example of processing performed by the analysis unit 50.

The analysis unit 50 obtains the first and second spectrums at each irradiation position measured as described above (S20).

Then, the analysis unit 50 extracts a signal component of the secondary electrons based on the first and second spectrums at each irradiation position (S22).

Then, the analysis unit 50 determines the intensity of the secondary electrons for each of the irradiation positions (S24). Here, the peak of the secondary electrons in the energy spectrum of the electrons is inherent in the substance. Therefore, the intensity of the peak inherent in each element is determined as the intensity of the secondary electrons, so that an image representing the distribution of the elements can be obtained. The intensity of the secondary electrons is, for example, a peak to peak value (the difference between the peak value of a positive peak and the peak value of a negative peak) in the difference spectrum S3. The intensity of the secondary electrons may be the integrated intensity of the peak in the difference spectrum S3.

Then, the analysis unit 50 generates a secondary electron image based on the intensity of the secondary electrons for each irradiation position (S26). For example, a secondary electron image representing the intensity distribution of the secondary electrons is generated by expressing the intensity of the secondary electrons at each irradiation position as the brightness of a pixel corresponding to the irradiation position. When the intensity of a peak inherent in each element is determined as the intensity of secondary electrons, an image representing the distribution of the elements can be generated.

By the above-described processing, a secondary electron image can be generated.

1.5. Effects

The electron microscope 100 includes an analysis unit 50 which extracts a signal component of the secondary electrons based on the first spectrum obtained by detecting electrons by the electron analyzer 30 under application of the first bias voltage to the specimen S and the second spectrum obtained by detecting electrons by the electron analyzer 30 under application of the second bias voltage different from the first bias voltage to the specimen S. In the electron microscope 100, the analysis unit 50 determines the difference between the first spectrum and the second spectrum and extracts a signal component of the secondary electrons based on the difference.

Therefore, the electron microscope 100 can extract a signal component of the secondary electrons from the spectrum of electrons emitted from the specimen S, so that the spectrum of the secondary electrons may be obtained.

For example, using a secondary electron detector which detects secondary electrons, secondary electrons and backscattered electrons cannot be clearly distinguished and detected. In contrast, as described above, in the electron microscope 100, the bias voltage applied to the specimen is varied, so that a signal component of the secondary electrons is extracted and the spectrum of the secondary electrons is obtained, and the secondary electrons and backscattered electrons can be distinguished more clearly from each other as compared to the case of using the secondary electrode detector.

In the electron microscope 100, the analysis unit 50 performs processing extracting a signal component of the secondary electrons based on the first spectrum and the second spectrum for each irradiation position on the specimen S, and processing for generating a secondary electron image representing the distribution of the intensities of the secondary electrons based on the intensity of the secondary electrons for each irradiation position. Therefore, the electron microscope 100 can obtain a secondary electron image less affected by the backscattered electron.

2. Second Embodiment 2.1. Electron Microscope

Figure 10:
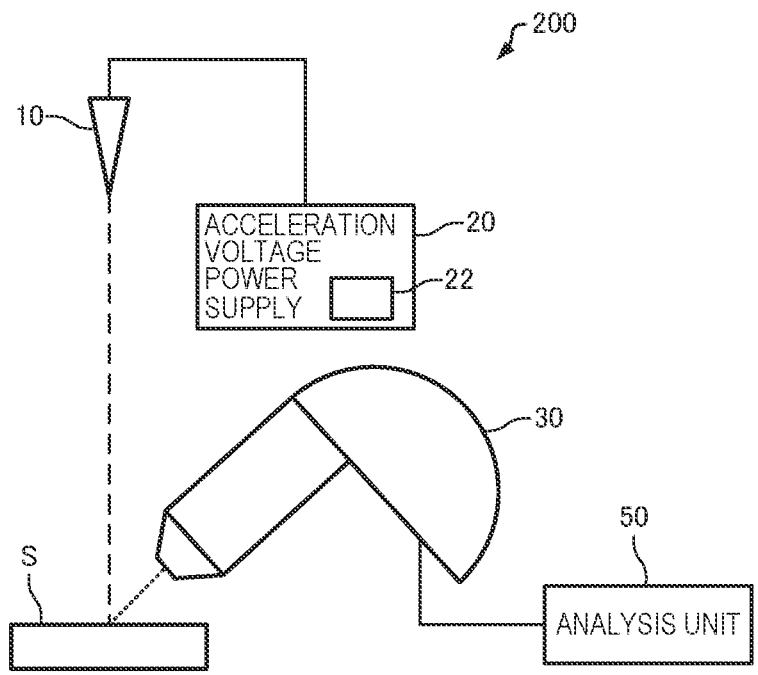
FIG. 10 is a diagram illustrating a configuration of an electron microscope according to a second embodiment of the invention.

Hereinafter, an electron microscope according to a second embodiment of the invention will be described with reference to the drawings. FIG. 10 is a diagram illustrating a configuration of an electron microscope 200 according to the second embodiment. In the electron microscope 200 according to the second embodiment, the components having the same functions as the components of the electron microscope 100 according to the first embodiment are designated by the same reference characters, and the detailed description thereof will not be provided.

In the electron microscope 100, the bias voltage applied to the specimen S is varied, so that a signal component of the secondary electrons is extracted from the energy spectrum of the electrons emitted from the specimen S and the spectrum of the secondary electrons is obtained.

In contrast, in the electron microscope 200, the kinetic energy of the electron beam the electron gun 10 is varied, so that a signal component of the backscattered electrons is extracted from the energy spectrum of the electrons emitted from the specimen S and the spectrum of the backscattered electron is obtained.

In the electron microscope 200, the kinetic energy of the electron beam is varied by varying the acceleration voltage. The acceleration voltage power supply 20 includes a variable voltage applying unit 22 which varies the acceleration voltage. The acceleration voltage power supply 20 functions as an energy applying unit which varies the kinetic energy of the electron beam.

2.2. Principles

In the electron microscope 200, a specimen S is irradiated with an electron beam, the electron analyzer 30 detects electrons emitted from the specimen S as a result of the irradiation and extracts a signal component of backscattered electrons from the spectrum of the electrons obtained by the detection, and the spectrum of the backscattered electrons can be obtained. The principle will be described in the following.

Figure 11:
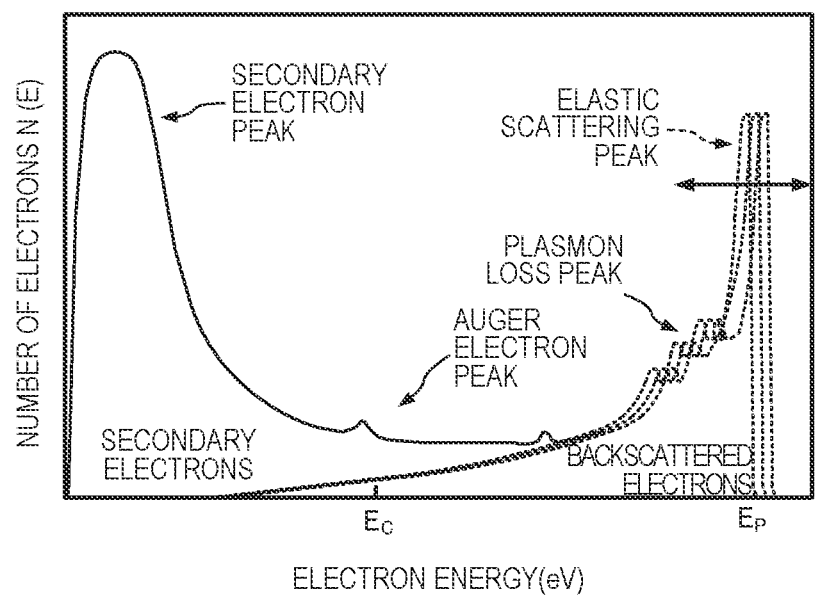
FIG. 11 is a graph illustrating an energy distribution of electrons emitted from a specimen surface when an acceleration voltage is varied.

FIG. 11 illustrates a distribution of the energy of electrons emitted from the specimen surface when the acceleration voltage is varied.

When electrons emitted from the specimen surface as a result of electron beam irradiation are detected by the electron analyzer 30, a spectrum is measured, and the kinetic energy of the electron beam is varied, a signal component of the backscattered electrons fluctuates as illustrated in FIG. 11. At the time, the signal component of the secondary electron does not fluctuate. The electrostatic potential $U_{EP}$ of the backscattered electrons the at the time is as follows.

$$U_{EP}=K+P=0+E_P+\Delta E_P \text{ (eV)}$$

where $E_P$ is the acceleration voltage, and $\Delta E_P$ is the variation in the acceleration voltage. $\Delta E_P$ is for example generated by the variable voltage applying unit 22.

Figure 12:
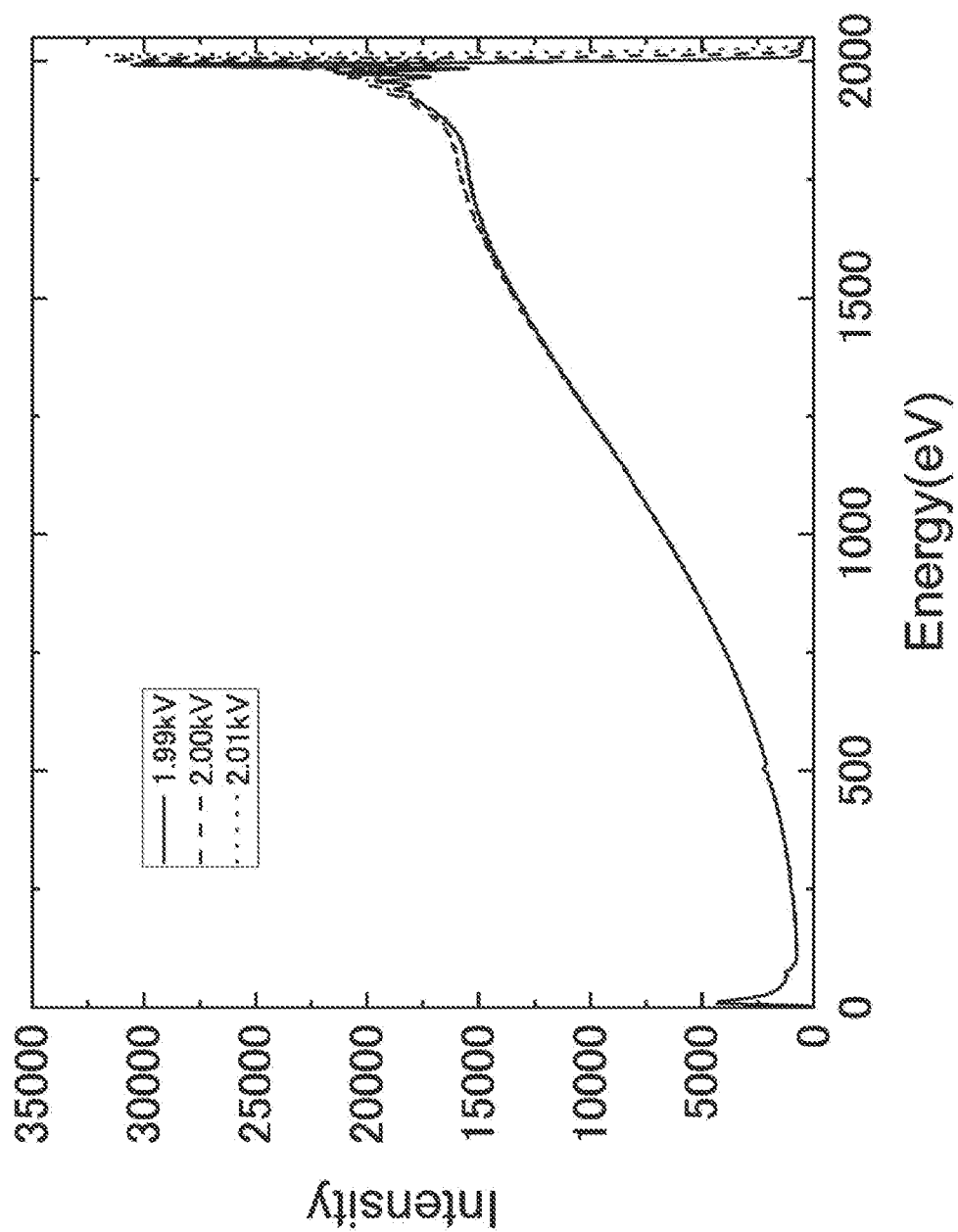
FIG. 12 is a graph illustrating change in spectrum when an acceleration voltage is varied.
Figure 13:
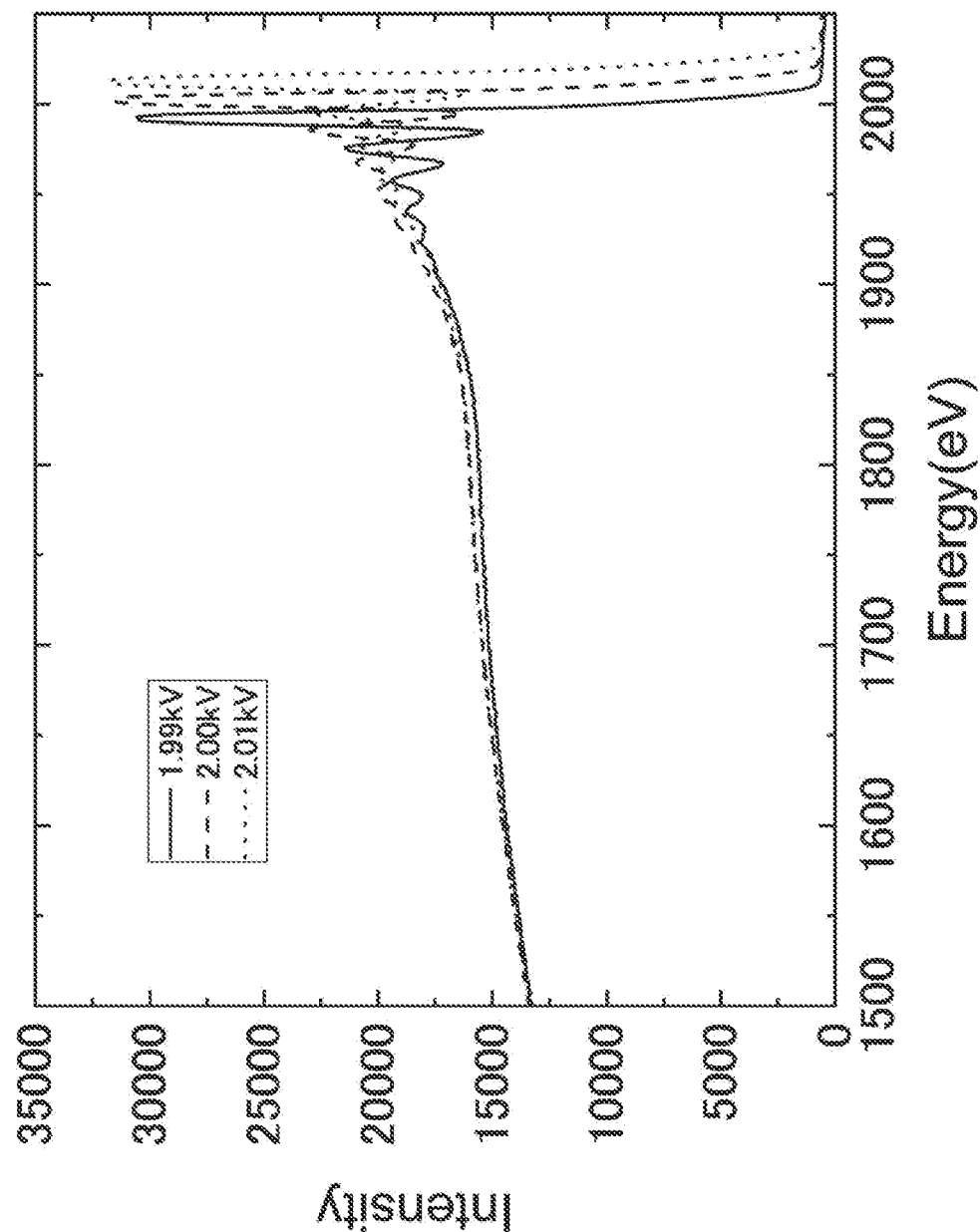
FIG. 13 is graph illustrating change in spectrum when an acceleration voltage is varied.
Figure 14:
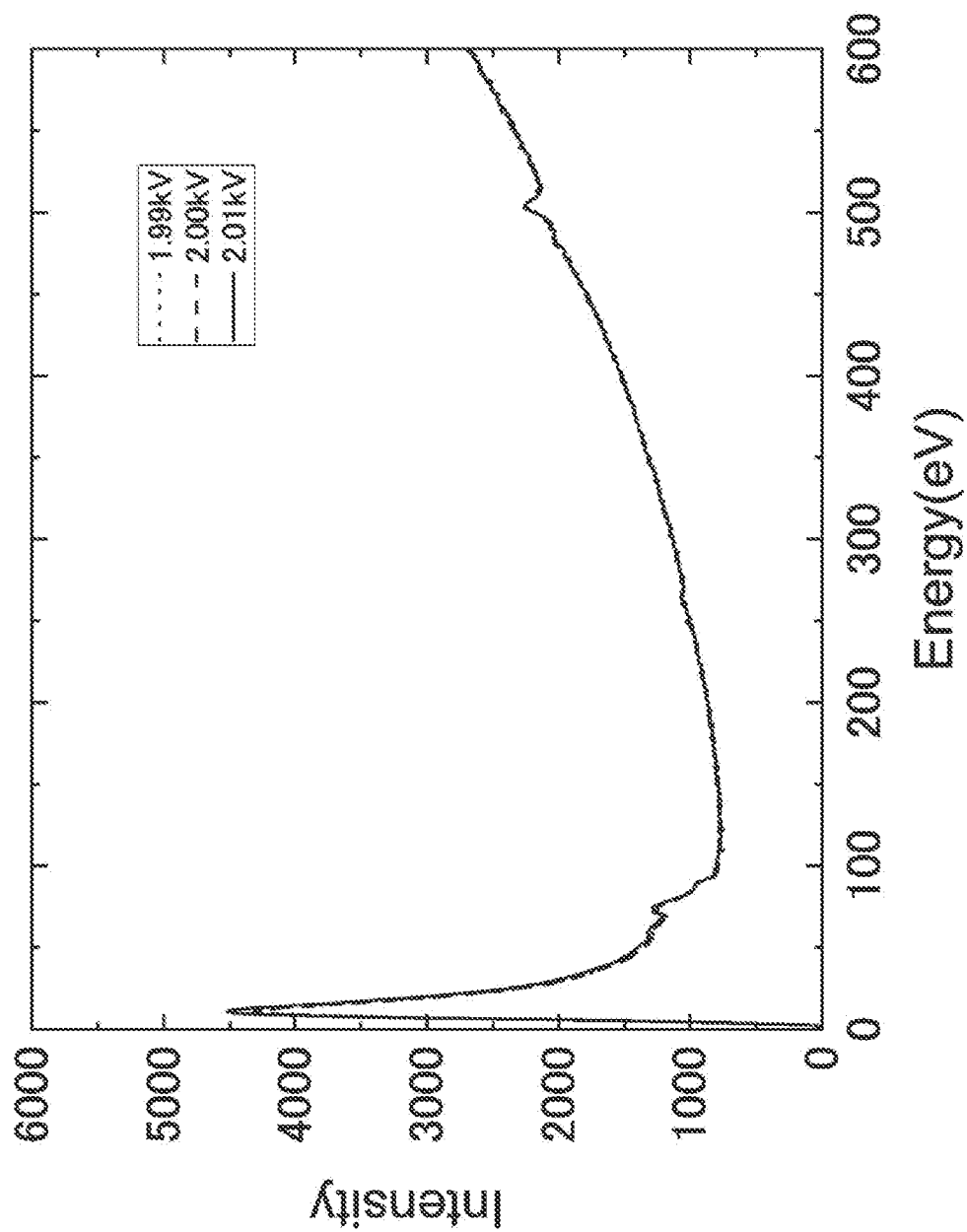
FIG. 14 is a graph illustrating change in spectrum when an acceleration voltage is varied.

FIG. 12 illustrates change in spectrum when the acceleration voltage is varied. FIG. 13 is an enlargement of the high energy side in FIG. 12, and FIG. 14 is an enlargement of the low energy side in FIG. 12. FIGS. 12 to 14 illustrate spectrums A, B, and C. Note that for the spectrum A, the acceleration voltage is 1990 V ($E_P$=2000 V, $\Delta E_P$=−10 V), for the spectrum B, the acceleration voltage is 2000 V ($E_P$=2000 V, $\Delta E_P$=0 V), and for the spectrum C, the acceleration voltage is 2010 V ($E_P$=2000 V, $\Delta E_P$=+10 V).

As illustrated in FIG. 13, when the acceleration voltage is varied, the peak derived from the backscattered electrons fluctuate. In contrast, as illustrated in FIG. 14, the peak derived from the secondary electrons does not vary. In this way, when the acceleration voltage is varied, the signal component of the backscattered electrons fluctuates, and the signal component of the secondary electrons does not change.

Figure 15:
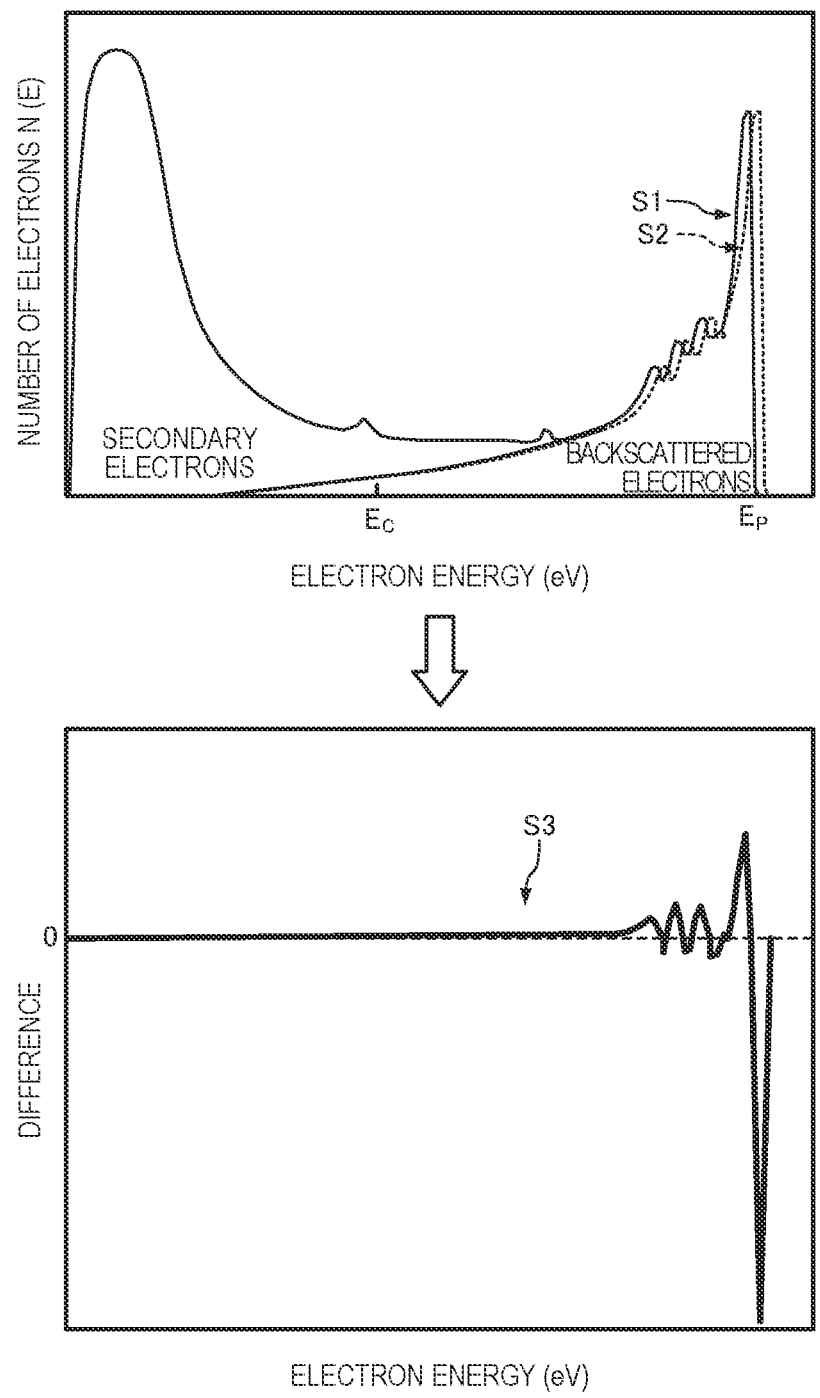
FIG. 15 is a graph illustrating a method of extracting a signal component of backscattered electrons.

FIG. 15 is a graph illustrating a method of extracting a signal component of backscattered electrons.

As described above, when the acceleration voltage is varied to vary the kinetic energy of the electrons, the signal component of the backscattered electrons fluctuates and the signal component of the secondary electron does not fluctuate. In this way, for example, as illustrated in FIG. 15, a signal component of the backscattered electrons can be extracted based on the first spectrum S1 while the kinetic energy of the electrons is set to first kinetic energy, and the second spectrum S2 while the kinetic energy of the electrons is set to second kinetic energy different from the first kinetic energy. For example, the difference between the first spectrum S1 and the second spectrum S2 can be determined, and a signal component of the secondary electrons can be extracted based on the difference.

Specifically, when the difference S1−S2 between the first spectrum S1 and the second spectrum S2 is obtained, a difference spectrum S3 is obtained as illustrated in FIG. 15. The difference spectrum S3 has the difference between the intensity of the first spectrum S1 and the intensity of the second spectrum S2 on the ordinate and the energy of the electrons on the abscissa.

When the acceleration voltage is varied to vary the kinetic energy of the electrons, the signal component of the backscattered electrons fluctuates, and therefore the difference spectrum S3 has for example a pair of positive and negative peaks corresponding to the peaks derived from the secondary electrons in the first and second spectrums S1 and S2. In contrast, since the peak derived from the secondary electrons does not fluctuate even when the kinetic energy of the electrons is varied, the difference spectrum S3 does not have peaks corresponding to the peaks derived from the secondary electrons in the first and second spectrums S1 and S2. Therefore, the signal component of the backscattered electron can be extracted by determining the difference S1−S2 between the first spectrum S1 and the second spectrum S2.

2.3. Processing

Figure 16:
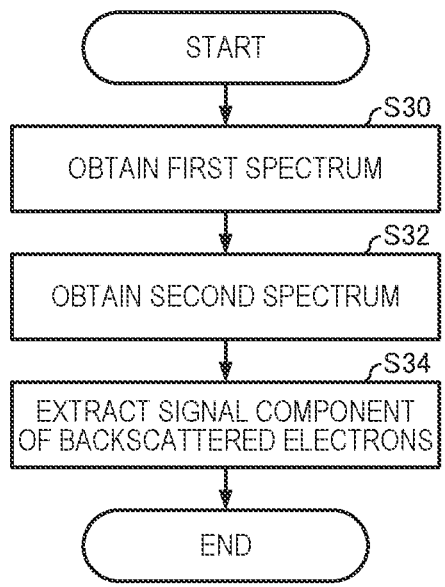
FIG. 16 is a flowchart illustrating an example of processing performed by an analysis unit.

FIG. 16 is a flowchart for illustrating an example of processing by the analysis unit 50.

The analysis unit 50 first obtains a first spectrum (S30). The first spectrum is a spectrum obtained by irradiating a specimen S with an electron beam and detecting the electrons emitted from the specimen S by the electron analyzer 30 in a state where the kinetic energy of the electron beam has been varied into first kinetic energy, or in a state where the acceleration voltage power supply 20 is supplying a first acceleration voltage to the electron gun 10.

Then, the analysis unit 50 obtains a second spectrum (S32). The second spectrum is a spectrum obtained by irradiating the specimen S with an electron beam and detecting electrons emitted from the specimen S by the electron analyzer 30 in a state where the kinetic energy of the electron beam has been varied into second kinetic energy different from the first kinetic energy, or in a state where the acceleration voltage power supply 20 is supplying a second acceleration voltage different from the first acceleration voltage to the electron gun 10.

Then, the analysis unit 50 extracts a signal component of the backscattered electrons based on the first and second spectrums (S34). For example, the analysis unit 50 determines the difference between the first spectrum and the second spectrum and extracts a signal component of the backscattered electrons based on the difference.

The above described processing allows a signal component of the backscattered electrons to be extracted.

2.4. Generation of Backscattered Electron Images

In the electron microscope 200, a backscattered electron image can be obtained by scanning the specimen S with an electron beam using a scanning deflector and measuring the first and second spectrums at each irradiation position on the specimen S.

Specifically, first and second spectrums are measured at each irradiation position on the specimen S. For example, the first spectrum at each irradiation position is measured by scanning the specimen S with an electron beam while the acceleration voltage is a first acceleration voltage and the kinetic energy of the electrons is first kinetic energy. Then, the second spectrum at each irradiation position is measured by scanning the specimen S with an electron beam while the acceleration voltage is second acceleration voltage and the kinetic energy of the electron is second kinetic energy. In this way, the first and second spectrums at each irradiation position can be obtained.

Then, the analysis unit 50 generates a backscattered electron image based on the first and second spectrums at each irradiation position.

Figure 17:
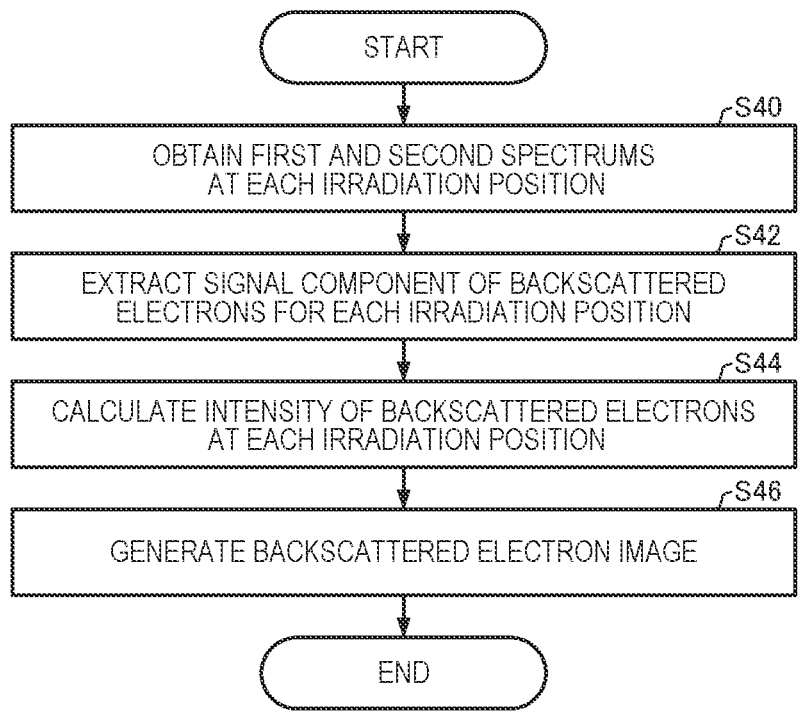
FIG. 17 is a flowchart illustrating an example of processing performed by an analysis unit.

FIG. 17 is a flowchart for illustrating an example of processing performed by the analysis unit 50.

The analysis unit 50 obtains the first and second spectrums at each irradiation position measured as described above (S40).

Then, the analysis unit 50 extracts a signal component of the backscattered electrons based on the first and second spectrums for each irradiation position (S42).

Then, the analysis unit 50 determines the intensity of the backscattered electrons for each irradiation position (S44). The intensity of the backscattered electrons corresponds, for example, to the integrated value of the absolute value of the difference between the intensity of the first spectrum and the intensity of the second spectrum. Here, the backscattered electron peaks that appear in the electron's energy spectrum are inherent in the substances. Therefore, by determining the intensities of the peaks inherent in the elements as the intensities of the backscattered electrons, an image representing the distribution of the elements can be obtained. The intensity is a peak to peak value. The intensity of the secondary electrons may be the integrated intensity of the peaks in the difference spectrum S3.

Then, the analysis unit 50 generates a backscattered electron image based on the intensity of the backscattered electrons for each irradiation position (S46). For example, a backscattered electron image representing the intensity distribution of the backscattered electrons is generated by expressing the intensity of the backscattered electrons at each irradiation position as the brightness of a pixel corresponding to the irradiation position. When the intensity of a peak inherent in each element is determined as the intensity of the backscattered electrons, an image representing the distribution of elements can be generated.

By the above-described processing, a backscattered electron image can be generated.

2.5. Effects

The electron microscope 200 includes the analysis unit 50 which extracts a signal component of backscattered electrons based on a first spectrum obtained by detecting electrons by the electron analyzer 30 in a state where the kinetic energy of the electron beam has been varied into first kinetic energy, and a second spectrum obtained by detecting electrons by the electron analyzer 30 in a state where the kinetic energy of the electron beam has been varied into second kinetic energy different from the first kinetic energy. The analysis unit 50 determines the difference between the first spectrum and the second spectrum and extracts a signal component of the backscattered electrons based on the difference.

Therefore, in the electron microscope 200, a signal component of the backscattered electrons can be extracted from the spectrum of electrons emitted from the specimen S, and the spectrum of backscattered electrons can be obtained.

For example, even using a backscattered electron detector which detects backscattered electrons, the backscattered electron detector cannot clearly distinguish between backscattered electrons and secondary electrons. In contrast, in the electron microscope 200, as described above, since a signal component of backscattered electrons is extracted by varying the kinetic energy of an electron beam and the spectrum of the backscattered electrons is obtained, the backscattered electrons and the secondary electrons can be distinguished clearly as compared to the case of using the backscattered electron detector.

In the electron microscope 200, the analysis unit 50 performs processing for extracting a signal component of the backscattered electrons based on the first spectrum and the second spectrum at each irradiation position on the specimen S, and processing for generating a backscattered electron image representing the intensity distribution of the backscattered electrons based on the intensity of the backscattered electrons at each irradiation position. Therefore, in the electron microscope 200, a backscattered electron image less affected by secondary electrons can be obtained.

In the electron microscope 200, the kinetic energy of the electron beam is varied by varying the acceleration voltage for accelerating the electron beam. Thus, the kinetic energy of the electron beam can be easily varied.

3. Third Embodiment

Figure 18:
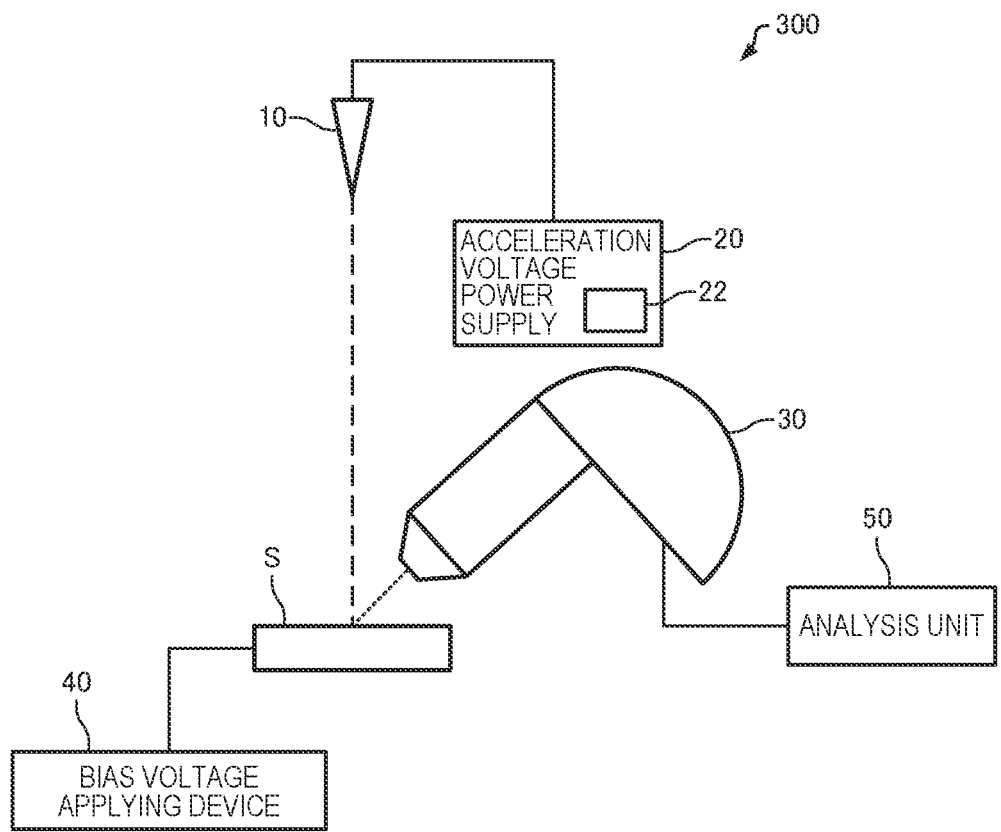
FIG. 18 is a diagram illustrating a configuration of an electron microscope according to a third embodiment of the invention.

Now, an electron microscope according to a third embodiment of the invention will be described with reference to the drawings. FIG. 18 is a diagram illustrating a configuration of an electron microscope 300 according to the third embodiment. Hereinafter, in the electron microscope 300 according to the third embodiment, the components having the same function as the components of the electron microscope 100 according to the first embodiment and the electron microscope 200 according to the second embodiment are denoted by the same reference characters, and the detailed explanation thereof will not be provided.

In the electron microscope 100 described above, the bias voltage applied to the specimen S is varied, so that a signal component of the secondary electrons is extracted from the energy spectrum of electrons emitted from the specimen S and the spectrum of the secondary electrons is obtained. In the electron microscope 200, the kinetic energy of the electron beam emitted from the electron gun 10 is varied, so that a signal component of backscattered electrons is extracted from the energy spectrum of electrons emitted from the specimen S, and the spectrum of the backscattered electrons is obtained.

In the electron microscope 300, the bias voltage applied to the specimen S is varied, so that a signal component of secondary electrons can be extracted from the energy spectrum of electrons emitted from the specimen S, and the spectrum of the secondary electrons is obtained. Furthermore, in the electron microscope 300, the kinetic energy of the electron beam emitted from electron gun 10 is varied, so that a signal component of backscattered electrons can be extracted from the energy spectrum of electrons emitted from specimen S, and the spectrum of backscattered electrons is obtained.

In the electron microscope 300, the bias voltage applied to the specimen S can be varied by the bias voltage applying device 40. Also, in the electron microscope 300, the acceleration voltage power supply 20 includes a variable voltage applying unit 22 which varies the acceleration voltage to vary the kinetic energy of the electron beam.

The analysis unit 50 performs processing for extracting a signal component of secondary electrons based on a first spectrum of electrons obtained under application of a first bias voltage to the specimen S and a second spectrum of electrons obtained under application of a second bias voltage to the specimen S. The analysis unit 50 also performs processing for extracting a signal component of backscattered electrons based on a third spectrum of electrons obtained in a state of the kinetic energy of the electron beam has been varied into first kinetic energy and a fourth spectrum of electrons obtained in a state where the kinetic energy of the electron beam has been varied into second kinetic energy.

Therefore, electron microscope 300 can extract a signal component of secondary electrons and a signal component of backscattered electrons from the energy spectrum of electrons emitted from the specimen S. In this way, the electron microscope 300 can obtain the spectrums of secondary electrons and backscattered electrons.

4. Other

It should be noted that the invention is not limited to the embodiments described above, and various modifications can be made within the scope of the invention.

According to the first embodiment, a signal component of secondary electrons is extracted from the energy spectrum of electrons emitted from a specimen on irradiation of the specimen with an electron beam. According to the second embodiment, a signal component of backscattered electrons is extracted from the energy spectrum of electrons emitted from a specimen on irradiation of the specimen with an electron beam. Meanwhile, in a charged particle beam device according to one embodiment of the invention, a signal component of secondary electrons may be extracted from the spectrum of particles emitted from a specimen on irradiation of the specimen with a primary charged particle beam instead of the electron beam, or a signal component of backscattered charged particles may be extracted from the spectrum of particles emitted from a specimen on irradiation of the specimen with a primary charged particle beam.

The backscattered charged particles are backscattered in the process of scattering when the specimen is irradiated with the primary charged particle beam.

The above-described embodiments and modifications are examples and the invention is not limited thereto. For example, the embodiments and the modifications may be combined appropriately.

The invention is not limited to the embodiments described above and various modifications can be made. For example, the invention includes configurations that are substantially the same as the configurations described in the embodiments. Substantially same configurations means configurations that are the same in function, method, and results, or configurations that are the same in objective and effects, for example. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. A charged particle beam device comprising:
   a charged particle beam source;
   an energy applying unit that varies kinetic energy of a primary charged particle beam emitted from the charged particle beam source;
   an analyzer that analyzes and detects particles including secondary electrons and backscattered charged particles that are emitted from a specimen by irradiating the specimen with the primary charged particle beam; and
   an analysis unit that extracts a signal component of the backscattered charged particles based on a first spectrum obtained by detecting the particles with the analyzer in a state where the kinetic energy of the primary charged particle beam has been varied into first kinetic energy, and a second spectrum obtained by detecting the particles with the analyzer in a state where the kinetic energy of the primary charged particle beam has been varied into second kinetic energy different from the first kinetic energy
   wherein the analysis unit obtains a difference between the first spectrum and the second spectrum and extracts the signal component of the backscattered charged particles based on the difference.

2. The charged particle beam device according to claim 1, further comprising a deflector that scans the specimen with the primary charged particle beam, wherein the analysis unit performs:
   processing for extracting a signal component of the backscattered charged particles based on the first spectrum and the second spectrum, for each irradiation position on the specimen; and
   processing for generating an image representing an intensity distribution of the backscattered charged particles based on intensity of the backscattered charged particles, for each irradiation position.

3. The charged particle beam device according to claim 1, wherein the energy applying unit varies the kinetic energy of the primary charged particles by varying an acceleration voltage that is used for accelerating the prime charged particle beam.

4. An analysis method for use in a charged particle beam device including a charged particle beam source and an analyzer that analyzes and detects particles including secondary electrons and backscattered charged particles that are emitted from a specimen by irradiating the specimen with a primary charged particle beam emitted from the charged particle beam source, the analysis method comprising:
   obtaining a first spectrum obtained by detecting the particles with the analyzer in a state where kinetic energy of the primary charged particle beam has been varied into first kinetic energy;
   obtaining a second spectrum obtained by detecting the particles with the analyzer in a state where the kinetic energy of the primary charged particle beam has been varied into second kinetic energy different from the first kinetic energy; and
   extracting a signal component of the backscattered charged particles based on the first spectrum and the second spectrum by obtaining a difference between the first spectrum and the second spectrum and extracting the signal component of the backscattered charged particles based on the difference.

* * * * *